United States Patent
Birurakis et al.

(10) Patent No.: US 10,649,024 B2
(45) Date of Patent: May 12, 2020

(54) SYSTEM FOR PROVIDING ATE TEST PROGRAMMING BY UTILIZING DRAG-AND-DROP WORKFLOW EDITING IN A TIME DOMAIN ENVIRONMENT

(71) Applicants: William Birurakis, Great Mills, MD (US); Ion A. Neag, Reston, VA (US)

(72) Inventors: William Birurakis, Great Mills, MD (US); Ion A. Neag, Reston, VA (US)

(73) Assignee: Pioneer Decisive Solutions, Inc., California, MD (US)

( * ) Notice: Subject to any disclaimer, the term of this patent is extended or adjusted under 35 U.S.C. 154(b) by 615 days.

(21) Appl. No.: 15/449,759

(22) Filed: Mar. 3, 2017

(65) Prior Publication Data
US 2018/0252763 A1    Sep. 6, 2018

(51) Int. Cl.
*G01R 31/28*  (2006.01)
*G01R 31/00*  (2006.01)
*G06F 8/00*   (2018.01)
*G06F 8/34*   (2018.01)

(52) U.S. Cl.
CPC ........... *G01R 31/2834* (2013.01); *G06F 8/34* (2013.01)

(58) Field of Classification Search
None
See application file for complete search history.

(56) References Cited

U.S. PATENT DOCUMENTS

| | | | | |
|---|---|---|---|---|
| 2004/0215361 A1* | 10/2004 | Hlotyak | ........... | G01R 31/31907 700/121 |
| 2006/0271322 A1* | 11/2006 | Haggerty | ............ | G06F 11/2273 702/108 |
| 2011/0099424 A1* | 4/2011 | Rivera Trevino | ..... | G06F 11/263 714/25 |
| 2012/0117537 A1* | 5/2012 | Sierk | ...................... | C07H 21/00 717/113 |
| 2013/0346948 A1* | 12/2013 | Zhang | ................. | G06F 11/3684 717/125 |
| 2014/0237292 A1* | 8/2014 | Chan | ................... | G06F 11/2733 714/32 |
| 2014/0324378 A1* | 10/2014 | Elston | ................... | G06F 11/263 702/123 |

\* cited by examiner

*Primary Examiner* — Justin R Knapp
(74) *Attorney, Agent, or Firm* — Clark A. Puntigam; Jensen & Puntigam P.S.

(57) ABSTRACT

A drag-and-drop workflow editor in an Automated Test Equipment (ATE) environment to create coherent time domain aligned test programs. This includes graphical interface channel diagrams with channel headers, channel timelines, designer items defining test operations, measurement references and trigger references to define temporal relationships in a time domain environment.

47 Claims, 7 Drawing Sheets

SYSTEM FOR PROVIDING ATE TEST PROGRAMMING BY UTILIZING DRAG-AND-DROP WORKFLOW EDITING IN A TIME DOMAIN ENVIRONMENT

TECHNICAL FIELD

The present invention relates to the field of Automated Test Equipment (ATE) test programming. More particularly, the invention relates to ATE software for creating test programs in a drag-and-drop workflow editor respecting time domain constructs and executing said test programs to control instrument instructions in a coherent time domain.

BACKGROUND OF THE INVENTION

Presently, many ATE Test Program editors are based on sequential program instructions. In other words, users write computer program instructions to create and modify test programs that execute in a sequential order. This is often cumbersome for users because the programming interface to most instrument instructions require in-depth technical knowledge of the inner workings of the underlying test instrument and creation requires knowledge of a programming language compatible with the test instrument. This also limits the execution of instrument instructions to be sequential which will generally result in lengthy execution times and repeated instrument operations. Modern ATE instruments have added the ability to perform multiple operations in parallel. That is, an instrument may now source different stimuli on multiple channels at once, or may now make different acquisitions on multiple channels at once. Traditional test programming languages cannot easily take advantage of these features thus limiting the capabilities of the test program and ATE systems. Further, test programs can be complex and lengthy. Hence, there is a need to improve test program editors to more easily accommodate creation of complex test programs, especially to more easily enable multiple instrument operations being executed in parallel within a coherent time domain.

The following comprises a glossary of nomenclature used herein:

ATE Execution Engine—The specific component or capability of an ATE Test Executive that executes predefined test programs.

Automated Test Equipment (ATE)—an apparatus that performs tests on a device using automation to quickly perform stimuli and acquisitions and evaluate the results of said stimuli and acquisitions. The use of ATE includes reference to Automated Test System (ATS) and other names for like systems that perform similar testing processes.

ATE Test Executive—software that operates as the overall manager of component systems in an ATE. More specifically, the test executive enables the creation and configuration of test programs as well as controls the execution of said test programs.

Coherence—maintaining phase and relationship of signal stimuli and acquisition.

Instrument Capability—A logical ability of an instrument resource. Generally describes the type of measurement to make or signal to source, and the associated physical pins/ports on the instrument.

Instrument Configuration Window—A graphical display of the current operation execution properties, allowing the user to change those properties and then save the changed properties for execution at runtime. Instrument configuration windows allow the execution of the operation with the execution properties currently displayed in the window.

Instrument Operation—The logical instrument action, which may be a combination of physical instrument actions. That is, an operation may describe multiple actions which are performed together to accomplish a task.

Instrument Resource—A physical asset contained within the ATE.

IS—Instrument Start.

IOL—Instrument Operation Length.

$T_0$—defines when the test timing starts.

$T_{0+IS}$—defines when an instrument operation starts.

$T_{0+IS+IOL}$—defines the end time of an instrument operation.

$T_n$—discrete time instance in time domain with reference to $T_0$.

Temporally Coherent—Deterministic within the time domain.

Test Group—A test group consists of one or more individual tests.

Test Program—A set or collection of test groups.

Test Sequence—A series of operations that the user specifies for execution.

Unit Under Test (UUT)—A device or component that is being tested such as a circuit card or assembly of electronic components.

Interface Test Adapter (ITA)—A customized interface test adapter, or "fixture" that adapts the ATE's resources to the UUT.

SUMMARY OF THE INVENTION

The system for providing user created test programs for automatic test equipment (ATE), comprises: a graphical interface display responsive to a user's interaction and/or instructions for producing ATE operation instructions wherein the display includes a plurality of channels representing coherent time domain timelines; a plurality of first icons available to the user from a plurality thereof representing channel headers, for application to the graphical display; a plurality of second icons available to the user from a plurality thereof for application to the graphical display representing different designer items for various ATE test operations; and a test executive processor responsive to the user defined graphical display for carrying out selected ATE test operations in a coherent time domain manner.

The method for providing user created test programs for automatic test equipment (ATE), comprises the steps of: providing a graphical display responsive to a user's interaction and/or instructions for producing ATE operation instructions wherein the display includes a plurality of channels representing coherent time domain timelines; providing a plurality of first icons available to the user from a plurality thereof representing channel headers, for application to the graphical display; providing a plurality of second icons available to the user from a plurality thereof for application to the graphical display representing different designer items for various ATE test operations; and processing the user defined graphical display for carrying out selected ATE test operations in a coherent time domain manner.

DETAILED DESCRIPTION

Figure 1:
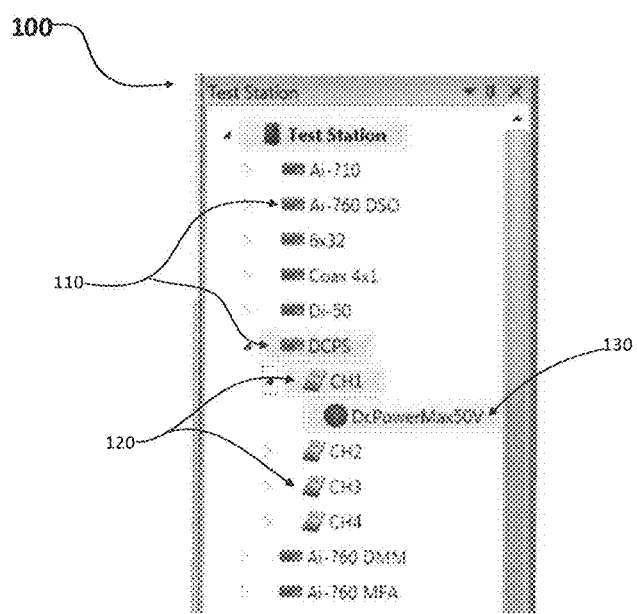
FIG. 1 is an exemplary screen depiction illustrating how test station assets, resources and capabilities are arranged in the Test Station Asset Configuration tab within the test executive environment.

ATE test executives present today on the market include instrument operations that comprise test programs defined in a pure sequential way. The test executive described herein provides an innovative ATE test programming language or technique that allows users to quickly create test program sets utilizing drag-and-drop workflow editing in a coherent time domain construct, and a temporally-coherent execution engine that performs instrument operations in a time-deterministic manner.

In general, in one aspect, the invention comprises an improved ATE test executive program, which provides instrument resource, instrument capability, instrument channel, and designer item functionality for superior configuration of the desired execution timing of automated test instrument instructions. Each designer item is coherently aligned in the time domain. The ATE test executive includes an engine to ensure the programmed instrument instructions are executed consistent with the desired execution timing in a temporally coherent manner.

This improved ATE test executive contains a number of important innovations to enable the development of time-coherent test programs by users with a minimum of programming experience. This test executive displays designer items in a graphical manner, allowing the user to configure when these operations execute with respect to one another. The test executive engine then parses this graphical representation of the test program to execute the instrument operations in a time-domain deterministic manner.

The graphical display of this test executive includes aspects of related art software test executives and introduces many new concepts. It contains new graphical concepts such as channel diagrams, channel headers, channel timelines, measurement references, trigger references, and temporally aligned designer items.

The execution of test programs by the test executive engine is central to the additional functionality and innovation provided by this test executive. The engine is responsible for ensuring that instrument operations begin and end at the times the user has specified. This ensures instrument operations occur at the same time after a test has started every time the test executes (repeatable). As a result, two instrument operations on different channels, and hence potentially using different instruments, will execute at the same time with respect to the other every time the test executes. Instrument operations can thus be said to be temporally aligned.

The primary display work area of the test executive editor, when creating a test program, consists of a channel diagram which contains multiple channels, each channel further containing a channel header describing the configuration of the channel and a timeline containing the designer items of the channel.

Channel Headers

Once added to the channel diagram, an instrument channel header is configured via a drag-and-drop process from a list of user-configured ATE assets. Each instrument channel is assigned one instrument capability. An instrument capability defines the channel type to be configured. Only designer items consistent with that channel type may then be created via drag-and-drop on that channel.

A channel type may restrict valid designer items to a single type of instrument operation, or may allow multiple types of designer item. Non-instrument specific designer items may be created on any type of channel. For instance, once an analog generation capability has been assigned to a channel, the only designer item that controls instrument operations that may be created upon that channel is the Generate designer item in the Analog palette. Non instrument operation designer items such as those in the User I/O palette, Timing and Triggering palette, and Procedures palette are valid and may also be created upon the channel.

Further, physical instrument ports associated with the selected instrument capability may be associated with Unit Under Test (UUT) pins, allowing the user to define a switching path between the two pins.

Channel Timeline

The channel timeline contains the designer items for that channel. Each channel timeline on the channel diagram is displayed in a temporally aligned manner. The user then creates designer items on the channel diagram via a drag-and-drop process from a toolbox of predefined operations.

The timeline contains a grid display to which designer items may be locked. This grid display describes intervals of time to which instrument operations may be performed. There is a minimum size of these divisions; that is, there is a nominal amount of time to which the test executive engine may guarantee the time-coherence of instrument operations.

The workflow editor provides standard graph functions such as zooming and panning. In addition to these graph functions, the divisions of the grid displayed on the timeline may be zoomed to change the amount of time each division describes. In one embodiment, the change of division size is accomplished via a list of sizes from a combo-box. The change of division size allows a quick transition between an overview of the channel timeline with a large division size, and a detailed view of specific channels or designer items with a small division size.

Designer Items

A designer item is a graphical representation of an instrument operation or of a generic (non-instrument) operation that is created on the channel timeline. Designer items are pre-defined based on the configured ATE assets and the capabilities of those assets. Each available designer item is presented in a toolbox from which the user may drag-and-drop a representation of the desired designer item onto a channel timeline.

The position of each designer item on the channel timeline intrinsically describes and displays the start time of the operation associated with the designer item with respect to the beginning of the test. The length of some designer items define the duration of the operation associated with that designer item and implicitly the end time of that operation. Examples of operations where the duration has an important role are: analog signal generation, analog waveform acquisition, digital stimulus, and other continuous operations. In contrast to existing test executive editors, this places an emphasis on the instant in the time domain at which an instrument operation occurs, not simply its position in a sequence of instrument operations.

Several generic types of designer items associated with instrument operations are defined by the test executive, which are then combined into groups, including Analog Operations, Digital Operations, Bus Operations, and Switching Operations. Non-instrument operations also exist, which perform actions but do not communicate with external hardware. User Input & Output Operations, and Procedures, are groups which contain non-instrument operation designer items.

Non-instrument specific designer items provide the flexibility needed in designing a complex test in a graphical mode. In a few embodiments these generic designer items represent operations for user interaction, operations that can be customized by the user during test development and operations needed in complex structures, such as looping. Also under this generic, non-instrument specific category fall two designer items that are specific to the parallel design of time-coherence tests: the measurement reference and the trigger reference, described in detail in subsequent paragraphs.

Each designer item associated with an instrument operation describes a logical instrument action, which may be a combination of physical instrument actions. That is, an instrument operation may describe multiple actions which are performed together to accomplish a task. To further enhance the simplicity of configuration the invention embodies, designer items can be configured by the user via the use of an instrument configuration window.

Each designer item stores the execution properties necessary to perform the associated operation. In one embodiment, these properties may be configured by the user via an instrument configuration window. Instrument configuration windows may take many forms and each designer item may be associated with an instrument configuration window depending upon the specific capability assigned to the channel and the specific operation to be performed. An instrument configuration window allows the user to change the execution properties of the designer item in a graphical manner. In one embodiment, instrument configuration windows are opened by double-clicking on the corresponding designer item.

Measurement References

A measurement reference is a non-instrument specific operation time constraint selected by the user from the designer items toolbox that is placed onto the channel timeline via a drag-and-drop process that allows a user to temporally align signal measurements across multiple channels. This adds extra functionality to the temporal alignment described by the position and size of the designer item as displayed on the channel timeline. Measurement references allow measurements to be synchronized within an instrument operation, for instance to make a measurement at the same time of two different signals, regardless of when the acquisition of each signal was originally started. One embodiment of a measurement reference is a vertical line on the channel timeline to which the starting time of a measurement may be aligned and 'locked'. Once 'locked', the time a measurement is made will move together with, and be displayed as temporally aligned with, the measurement reference.

Trigger References

A trigger reference is a non-instrument specific operation time constraint selected by the user from the designer items toolbox that is placed onto the channel timeline via a drag-and-drop process that allows a user to temporally align instrument operations with a greater precision than the displayed position and size of the corresponding designer item. Normal designer items are temporally aligned within some minimum time division. In one embodiment of the innovation, this time division is 10 milliseconds. Time division increments are dependent on CPU processor speeds and instrument instruction latencies. A trigger reference defines a physical connection between two instrument capabilities, and configures the designer items associated with the trigger reference to perform instrument operations using a hardware trigger to begin or end based on signals sent over the physical connection. One embodiment of a trigger reference is a vertical line on the channel timeline to which the starting time or ending time of a designer item may be aligned and 'locked'. Once 'locked', the time the instrument operation associated with the designer item starts or stops respectively will move together with, and be displayed as temporally aligned with, the trigger reference.

The ATE Test Executive Engine

The engine is the component of the test executive responsible for maintaining temporal coherence of instrument operations while a test program is executing. Aspects of the invention already described enable the user to configure designer items to a specific timing interval. The engine interprets this information, and executes a test program maintaining the temporal position of the instrument operations corresponding to each designer item.

The engine interprets the information configured by the user on the channel diagram. Each designer item may be associated with one or more instrument operations, and the engine converts the user configured designer items into the underlying instrument operations while maintaining the temporal information configured by the user.

For each test, the engine then uses the configured instrument operations and the configured temporal positions to execute the test while maintaining time coherence. The engine parses the test and stores the time references at which an instrument operation must occur. At each of the stored time reference, each instrument operation configured to execute at that time reference is performed and the start and stop time of its execution is noted.

If the current operation is completed before the next time reference at which an instrument operation is configured, the engine waits until that next time reference. If the end time of the current instrument operation is greater than the desired start time of the next operation, that is if the current instrument operation does not complete before the start time of the next instrument operation, the engine stores the amount of time exceeded, and immediately runs the next instrument operation. Thus time coherence of the test is preserved.

U.S. patent application Ser. No. 15/081,083 and U.S. patent application Ser. No. 15/335,148 are both owned by the assignee of the present invention. The contents of both applications are hereby incorporated by reference herein.

Several illustrative embodiments of the invention are described below. It will be recognized that in the manifestation of any such actual embodiment, application-specific conclusions based on developer specific goals, such as those pertaining to system-related constructs and constraints, may vary from one implementation to another. While such a development effort might be complex and time consuming, it would nevertheless be a routine undertaking for those of ordinary skill in the are having the benefit of this disclosure.

The word "exemplary" is used herein to mean "serving as an example, instance, or illustration." Any embodiment described herein as "exemplary" is not necessarily to be construed as preferred or advantageous over other embodiments. Those of ordinary skill in the art will recognize other embodiments may be utilized, and other changes may be made, without departing from the spirit or scope of the subject matter presented herein. Furthermore, the claimed subject matter may be implemented as a method, system, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any non-transitory computer-readable device, or media.

The illustrative embodiments described in the detailed description, drawings, and claims are not meant to be limiting. Other embodiments may be utilized, and other changes may be made, without departing from the spirit or scope of the subject matter presented here.

FIG. 1 represents an exemplary test station tree 100, as it was captured in the test executive environment, where all the instruments that are present in the system are represented as tree nodes 110. Each instrument consists of one or more resources that are represented as child nodes 120 of the instrument node 110. Each instrument resource consists of one or more instrument capabilities that are represented as child nodes 130 of the resource node 120. The names of the instrument nodes 110 are user configurable. The names of the resource nodes 120 and the names of the capability nodes 130 are pre-defined and they cannot be changed by the user.

Figure 2:
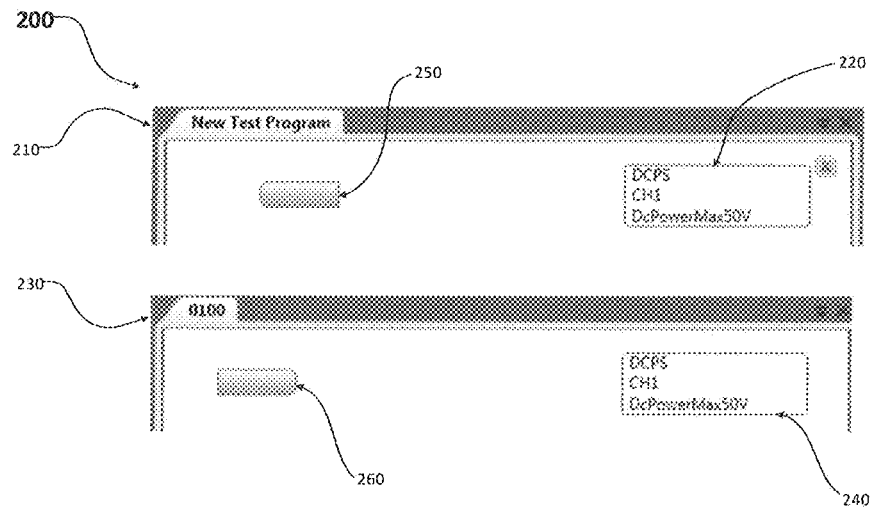
FIG. 2 consists of an exemplary screen depiction illustrating a global channel in the context of a test program, and another screen depiction illustrating the same global channel in the context of a test.

FIG. 2 represents an exemplary global channel 200 in the context of a test program 210, and in the context of a test 230, as they have been captured in the test executive environment. Each channel represents an instrument/resource/capability. A global channel represents a placeholder for global operations 250, 260, i.e. operations that are active outside a test. Test program global channels are placeholders for operations that can be active for the duration of the entire test program. Test Group global channels are placeholders for operations that can be active for the duration of the entire test group. As illustrated in this example the global channel represents a DC Power Supply Maximum 50V capability on Channel 1 of the instrument. This information can be seen on the channel header 220 and 240. The global channel can be configured only at the level at which it has been defined, in our example at the test program level 210, and it is unmodifiable at all other levels, as it can be seen in the example where the channel header 240 at test level 230 is grayed out. As illustrated in this example, the DC Power Supply on Channel 1 is started by global operation 250 and is active for the duration of the entire TPS until it is stopped in test number 0100 as denoted in 230 by the global operation. 260.

Figure 3:
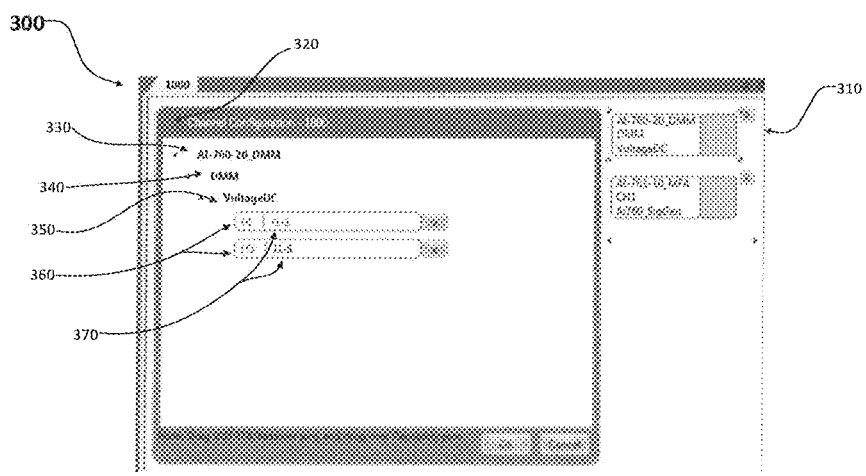
FIG. 3 is an annotated screen depiction illustrating the detailed configuration dialog of a channel header after it has been configured.

FIG. 3 represents an exemplary of a channel configuration process 300. There are two ways of configuring the channel: Drag & drop an instrument/resource/capability node (see FIG. 1) on the channel header 310 Open the channel configuration dialog 320 and drag & drop an instrument/resource/capability node (see FIG. 1) on to the dialog.

After the drag & drop operation, the selected instrument name 330, resource name 340 and capability name 350 are displayed in the configuration dialog 320 and in the channel header 310. To fully configure the channel, UUT or ITA pins 370 can be assigned to the instrument capability pins 360.

Figure 4:
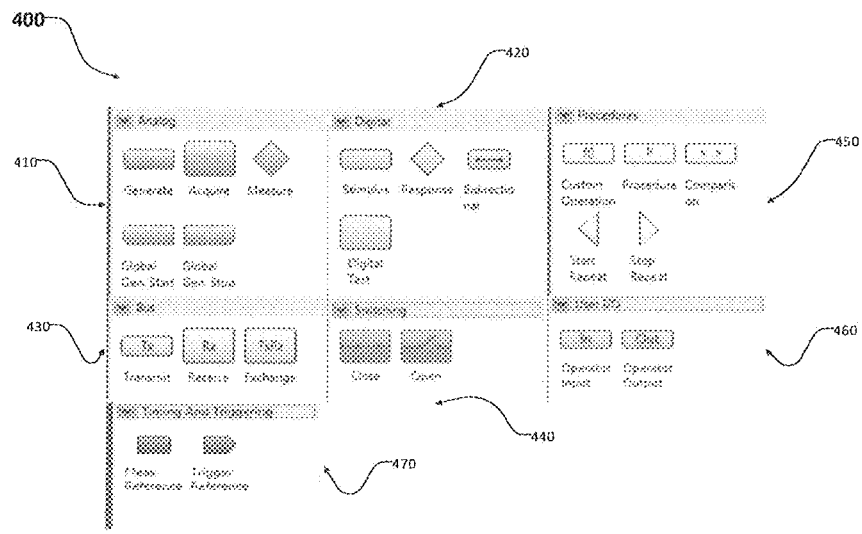
FIG. 4 is an exemplary screen depiction illustrating the different types of designer items, including instrument and non-instrument specific.

FIG. 4 illustrates an exemplary toolbox 400 of designer items that is available in the test executive environment. A designer item is the graphical representation of an operation. For instrument specific operations the corresponding designer items are grouped based on the type of the instrument capability. The Analog Palette 410 defines the designer items used in conjunction with analog instruments for operations such as generation of signals, acquisition of signals, measurements of signal characteristics. The Digital Palette 420 defines the designer items used in conjunction with the digital instruments for operation such as static stimulus, static response, static bidirectional, execution of dynamic digital patterns. The Bus Palette 430 defines the designer items used in conjunction with bus instruments for operations such as serial transmit, serial receive, serial exchange (transmit/receive). The Switching Palette 440 defines two designer items used in conjunction with switching cards, one for the operation that closes a switching path, and one for the operation that opens a switching path. The Procedures Palette 450 defines the designer items that are non-instrument specific. These items are used with operations such as external procedure, comparison operation, and repeat operations. Also under non-instrument specific operations there is the User Input/Output Palette 460 and the Timing and Triggering Palette 470. They define designer items used with operations such as operator input, operator output and trigger and measurement references. These designer items are dragged & dropped from their toolbox palette on to the channel diagram to create instrument or non-instrument specific operations.

Figure 5:
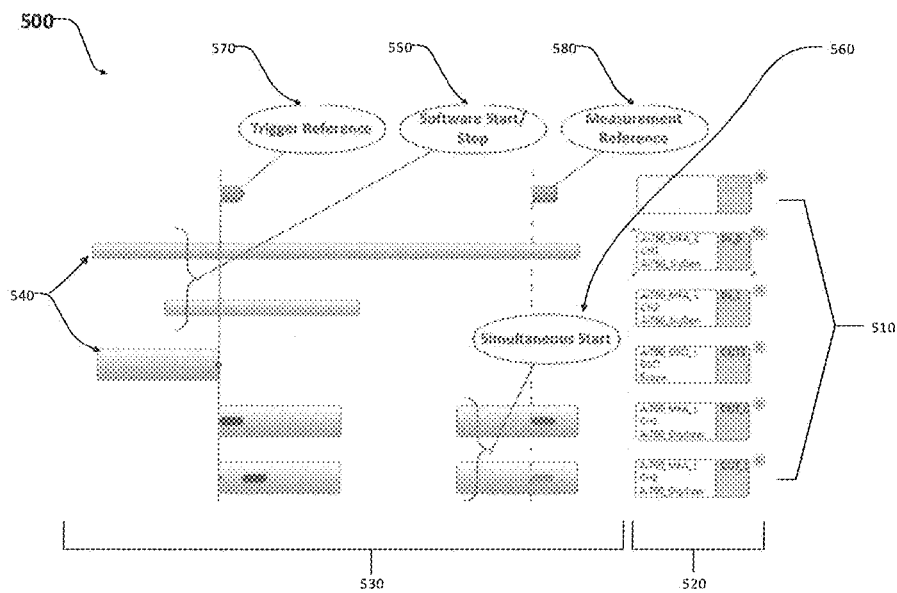
FIG. 5 is an annotated screen depiction illustrating how the channel diagram, channels, channel headers, channel timelines, trigger references, measurement references, and designer items are displayed in the test executive environment.

FIG. 5 represents an exemplary channel diagram 500 of a test as it is displayed in the test executive environment. The channel diagram 500 consists of one or more channels 510, each channel being a graphical representation of an instrument capability. Each channel consists of two parts: the channel header 520, which defines the instrument capability assigned to that channel, and the channel timeline 530, where the designer items 540 representing instrument operations will be placed in a temporal fashion. The placement of the designer item on the channel timeline determines the start time 550 of the corresponding instrument operation. In addition to this the width of the designer item determines the duration and implicitly the stop time of the corresponding instrument operation. Two or more designer items that are temporally aligned with their left edges will generate a simultaneous start 560 of the corresponding instrument operations. The placement of a trigger reference 570 on the channel diagram defines a physical connection between two instrument capabilities, and configures the designer items associated with the trigger reference to perform instrument operations using a hardware trigger to begin or end based on signals sent over the physical connection. The placement of a measurement reference 580 on the channel diagram defines a temporal alignment of signal measurements across multiple channels, which ensures a synchronization of two or more measurements performed on different signals regardless of when the acquisition of each signal was originally started.

Figure 6:
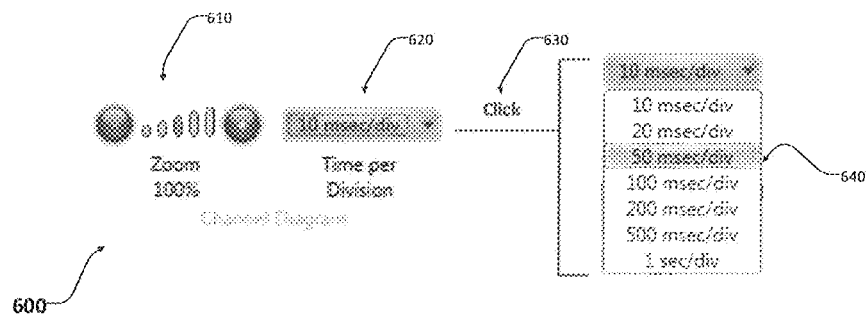
FIG. 6 is an exemplary screen depiction illustrating the Zoom toolbar button and the Time per Division configuration control in the test executive environment.

FIG. 6 illustrates the two features 600 that control the view mode of the channel diagram: a standard graph function zoom in and out 610 that enables changing the level of magnification of the channel diagram view; a list of predefined division sizes 640 that is displayed when user clicks 630 on the combo-box 620 featured in the channel diagram toolbar, allowing the selection of the time per division that controls the graphical grid on the channel diagram.

Figure 7:
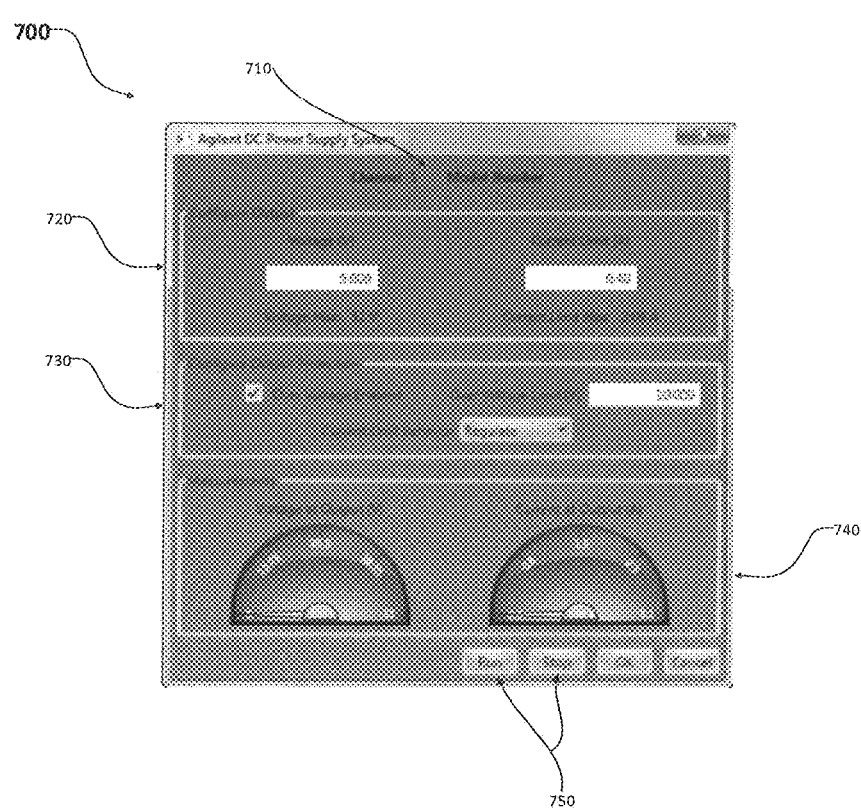
FIG. 7 is an exemplary screen depiction illustrating one implementation of an instrument configuration and control window.

FIG. 7 is an exemplary instrument configuration window 700 used to set the required attributes of an instrument operation. Information specific to the instrument capability 710 to which the "to be configured" operation belong to is displayed in the window title bar and if needed in the top part of the configuration window. For this embodiment of the configuration window the attributes that must be set are grouped under two categories: attributes that configure the output of the instrument 720, such as voltage and current limit level, and attributes that configure the protection of the output 730, such as over voltage limit, if over voltage is enabled or not. All configuration windows allow the execution of the instrument operation at design time, i.e. after the operation has been configured. A Run button and a Stop button 750 are provided for this purpose. This is a powerful feature that enables the user to verify that the operation attributes have been correctly specified, preventing an unexpected run-time error to occur during test program execution.

For signal acquisition operations the test executive environment allows the definition of measurement operations that will be performed on the acquired signal. Instrument configuration windows vary based on the specific instrument and the capabilities of that instrument.

Figure 8:
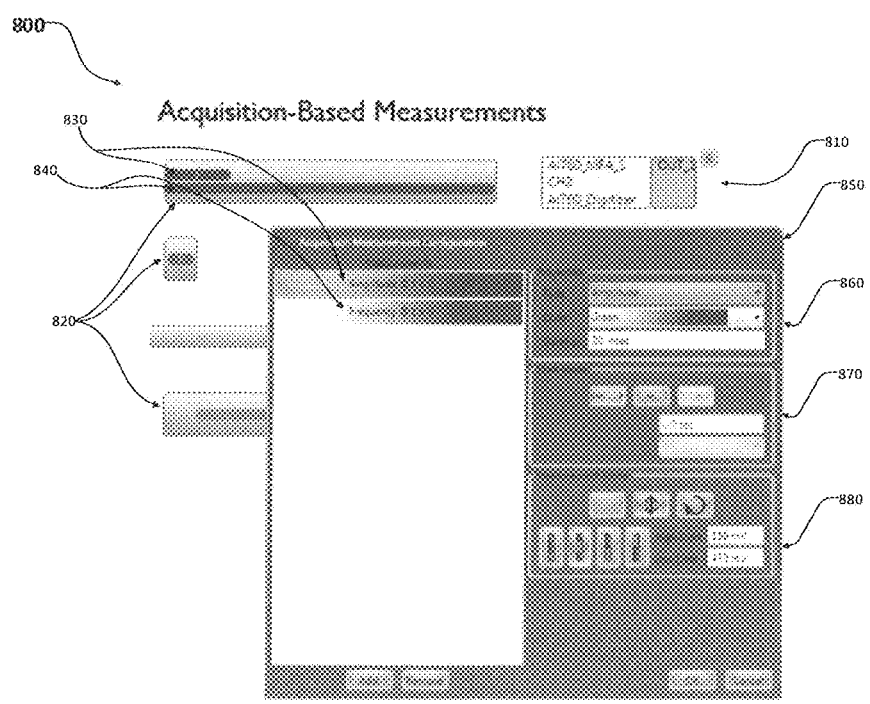
FIG. 8 consists of an exemplary screen depiction illustrating how acquisition-based measurements are displayed in the channel timeline, and another screen depiction illustrating the dialog where acquisition-based measurements are configured.

FIG. 8 illustrates one embodiment of acquisition-based measurements 800. In this illustration the channel headers 810 define instrument acquisition capabilities thus creating the placeholders, i.e. the channel timeline for the designer items 820 representing the acquisition operations. The example depicted in this figure show two measurements: one that measures the amplitude 830 of the acquired signal, and one that measures the frequency 840 of the acquired signal. The test executive environment provides a configuration dialog 850 where one or a plurality of acquisition-based measurements may be defined, where their properties 860 are set, where the measurement start mode 870 is specified, and where the measurement mode 880 is also configured. With regards to the start modes 870, an acquisition-based measurement can start at specified delay relative to the start time of the acquisition operation, or at the time determined by the measurement reference with which the measurement operation is aligned to. With regards to the measurement mode 880, a measurement can be in verify mode, which indicates that at run-time the result of the measurement will be compared with limits, or in monitor mode, which indicates that the measurement will run continuously at run-time until a desired measurement value is obtained.

Figure 9:
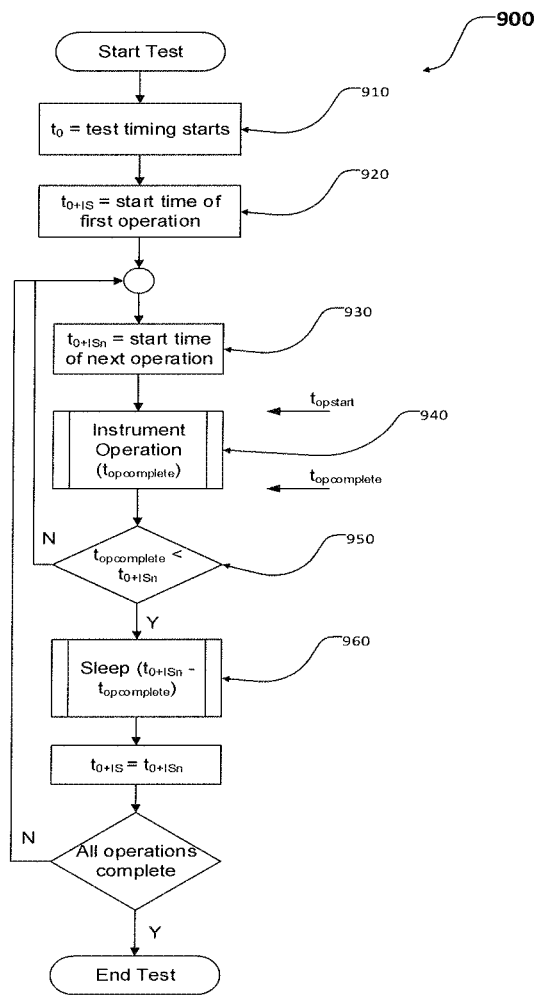
FIG. 9 illustrates the flowchart of the algorithm used by the engine to adjust the start time of instrument operations if the elapsed time of the currently executed instrument operation exceeds the configured duration of that instrument operation.

FIG. 9 represents the flowchart of the algorithm 900 used by the test executive engine to maintain the temporal alignment of the instrument operations at run-time. This algorithm is applied to every test; the timing of test operations is reset at the beginning of each test execution 910. Each instrument operation is timed 920 and the configured start time of the next instrument operation determined 930 before the current instrument operation executes 940. The actual time when the current instrument operation has completed is compared 950 with the configured start time of the next instrument operation to determine if the current instrument operation has executed in a timely fashion. If the duration of current operation exceeded configured time, it ran over the start time of the next operation then the test executive engine adjusts the start time of the remaining operations and immediately starts the execution of the next instrument operation. If the current instrument operation ran in its configured time then the test executive engine executes a software delay 960 to wait if necessary until the start time of the next instrument operation is reached, and then repeats this entire process for the remaining instrument operations of the current test.

Figure 10:
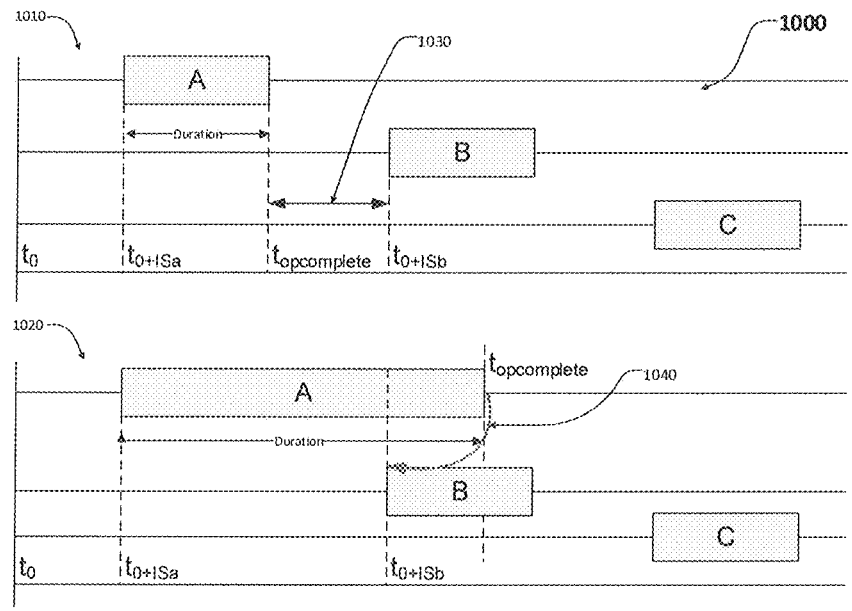
FIG. 10 illustrates the graphical representation of the algorithm described in FIG. 9 in the form of a flowchart.

For a better understanding of the algorithm described in FIG. 9, a graphical representation of this algorithm 1000 is illustrated in FIG. 10. The first diagram 1010 illustrates the test executive engine introducing software delays 1030 to ensure that each instrument operation starts at the configured time. This is the case where all instrument operations run in their configured time. The second diagram 1020 illustrates an instrument operation "A" exceeding its configured duration 1040 and causing the remaining operations to have their start time adjusted in order to maintain their temporal alignment.

Figure 11:
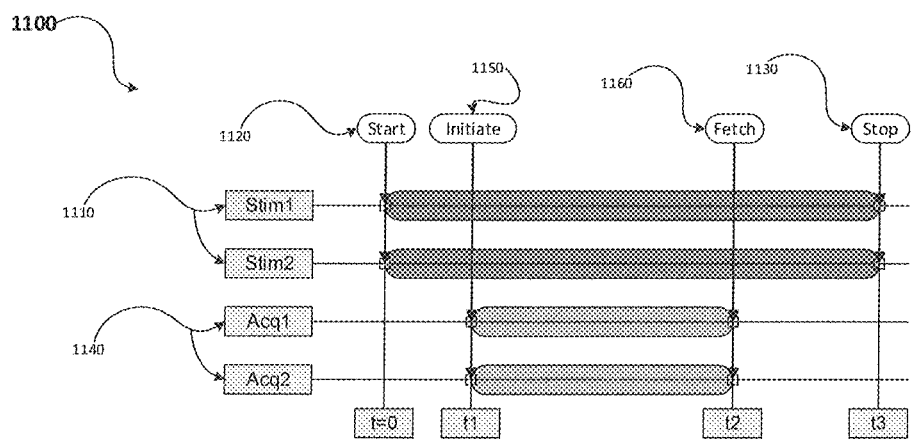
FIG. 11 illustrates how the test executive engine converts the user configured designer items into the underlying instrument operations while maintaining the temporal information configured by the user.

FIG. 11 illustrates how the test executive engine converts 1100 the user configured designer items into the underlying instrument operations 1110, 1140 while maintaining the temporal information configured by the user. The placement of the left edge of the designer item on the channel timeline represents the start time of the underlying instrument operation. In one embodiment the left edge of a designer item representing an analog stimulus operation 1110 is converted at run-time by the test executive engine into a start signal generation 1120. In a similar fashion the placement of the right edge of the designer item represents the end time of the underlying instrument operation. In the same embodiment the right edge of the designer item is converted at run-time into a stop signal generation 1130. The time when these operations occur is defined by the placement of these edges on the channel timeline. In another embodiment the left edge of the designer item representing an analog acquisition operation 1140 is converted at run-time into an initiate acquisition 1150, and the right edge of this designer item is converted at run-time into a fetch operation 1160. The time when these operations occur is defined by the placement of these edges on the channel timeline.

Although a preferred embodiment of the invention has been disclosed for purposes of illustration, it should be understood that various changes, modifications and substitutions may be incorporated in the embodiment without departing from the spirit of the invention, which is defined by the claims which follow.

What is claimed is:

1. A system for providing user created test programs for automatic test equipment (ATE), comprising:
a graphical interface display responsive to a user's interaction and/or instructions for producing ATE operation instructions wherein the display includes a plurality of channels representing coherent time domain timelines, a plurality of first icons available to the user from a plurality thereof representing channel headers, for application to the graphical interface display;

a plurality of second icons available to the user from a plurality thereof for application to the graphical interface display representing different designer items for selected ATE test operations; and a test executive processor responsive to the graphical interface display for carrying out the selected ATE test operations in a coherent time domain manner.

2. The system of claim 1, including a plurality of third icons available to the user from a plurality thereof representing a measurement reference for the selected ATE test operations and a plurality of fourth icons available to the user from a plurality thereof representing a trigger reference for the selected ATE test operations.

3. The system of claim 2, wherein selection of the application of the first, second, third and fourth icons to the graphical display is accomplished by a "drag-and-drop" operation.

4. The system of claim 3 wherein the drag-and-drop operation comprises adding a measurement reference to one of a plurality of designer item operations, including interactively updating properties specific to said measurement reference including a label and a start time.

5. The system of claim 3, wherein the drag-and-drop operation of a trigger reference comprises adding the trigger reference to one of a plurality of channel timelines and interactively updating the trigger reference including a label and a start time.

6. The system of claim 3, wherein shape and color of the first, second, third and fourth icons identify the selected ATE test operation.

7. The system of claim 2, wherein the measurement reference allows the user to temporally align signal measurements across multiple channels allowing measurements to be synchronized so as to make a measurement at a same time of two different signals regardless of when an acquisition of each signal originally started.

8. The system of claim 7, wherein the measurement reference is shown as a vertical line on a channel timeline display.

9. The system of claim 2, wherein the trigger reference is shown as a vertical line on a channel timeline to which a start time or ending time of a selected designer operation may be aligned and locked.

10. The system of claim 1, wherein each channel include a channel header and a channel timeline.

11. The system of claim 10, wherein the channel header defines an instrument capability assigned to that channel.

12. The system of claim 10, wherein a designer item operation is placed into the channel timeline.

13. The system of claim 12, wherein the designer item operation is limited by instrument capability defined by the channel header.

14. The system of claim 1, wherein unit under test pins are assigned to the channel headers.

15. The system of claim 1, wherein the instrument operation on the plurality of channels representing coherent time domain timelines can be resized to reconfigure the execution time of the test operation.

16. The system of claim 1, wherein each channel is assigned a single instrument capability or operation.

17. The system of claim 1, wherein non-instrument operations can be placed on any channel.

18. The system of claim 1, wherein a user may define on the graphical interface display a plurality of switching paths between unit under test pins and instrument capability pins.

19. The system of claim 1, wherein each channel timeline is displayed in a temporally aligned manner.

20. The system of claim 1, wherein the graphical interface display includes a zoom or pan capability.

21. The system of claim 1, wherein the system includes a grid display which sets out intervals of time during which instrument operations must be performed.

22. The system of claim 1, wherein the channel timeline displays a start time and a duration time of each designer item operation.

23. The system of claim 1, including an instrument configuration window wherein execution properties for a selected operation are configurable by the user.

24. The system of claim 1, including a time constant that allows the user to temporally align instrument operations with a greater particularity than a corresponding available designer operation.

25. The system of claim 1, wherein attributes of an instrument operation can be specified by the user and wherein said attributes can be verified to prevent a run-time error.

26. The system of claim 1, wherein the designer items operations are grouped in accordance with of instrument capability, including an analog capability, a digital capability and a bus capability.

27. The system of claim 1, including a time control function wherein if duration of a current ATE test operation exceeds its configured time, the processor adjusts a start time of remaining ATE test operations and then starts execution of a next ATE test operation, and if duration of the current ATE test operation is less than its configured time then the processor executes a delay until a start time of the next ATE test operation is reached.

28. The system of claim 1, wherein temporal alignment is maintained by using a left edge of a designer graphical icon as a start signal, and the right edge of a designer graphical icon as an end time of the operation, such that the ATE test operation is temporally aligned by placement of the left and right edges of the designer items for the selected ATE test operation icons on the channel time domain timeline.

29. A method for providing user created test programs for automatic test equipment (ATE), comprising the steps of:

providing a graphical display responsive to a user's interaction and/or instructions for producing ATE operation instructions wherein the display includes a plurality of channels representing coherent time domain timelines;

providing a plurality of first icons available to the user from a plurality thereof representing channel headers, for application to the graphical interface display;

providing a plurality of second icons available to the user from a plurality thereof for application to the graphical interface display representing different designer items for selected ATE test operations; and processing the user defined graphical interface display to carry out the selected ATE test operations in a coherent time domain manner.

30. The method of claim 29, including the step of providing a plurality of third icons available to the user from a plurality thereof representing a measurement reference for the selected ATE test operations and the step of providing a plurality of fourth icons available to the user from a plurality thereof representing a trigger reference for the selected ATE test operations.

31. The method of claim 30, wherein the selection of the application of the first, second, third and fourth icons to the graphical display is accomplished by a "drag-and-drop" operation.

32. The method of claim 31, wherein shape and color of the first, second, third and fourth icons identify the selected ATE test operation.

33. The method of claim 31 wherein the drag-and-drop measurement operation comprises adding a measurement reference to one of a plurality of designer item operations, including interactively updating properties specific to said measurement reference including a label and a start time.

34. The method of claim 31, wherein the drag-and-drop operation of a trigger reference comprises adding the trigger reference to one of a plurality of channel timelines and interactively updating the trigger reference including a label and a start time.

35. The method of claim 30, wherein each channel includes a channel header and a channel timeline.

36. The method of claim 35, wherein the channel header defines an instrument capability assigned to that channel.

37. The method of claim 35, wherein a designer item operation is placed into the channel timeline.

38. The method of claim 37, wherein the designer item operation is limited by instrument capability defined by the channel header.

39. The method of claim 30, wherein the instrument operation on the plurality of channels representing coherent time domain timelines can be resized to reconfigure the execution time of the test operation.

40. The method of claim 30, wherein each channel timeline is displayed in a temporally aligned manner.

41. The method of claim 30, wherein the measurement reference allows the user to temporally align signal measurements across multiple channels allowing measurements to be synchronized so as to make a measurement at a same time of two different signals regardless of when an acquisition of each signal originally started.

42. The method of claim 30, wherein attributes of an instrument operation can be specified by the user and wherein said attributes can be verified to prevent a run-time error.

43. The method of claim 29, including a grid display which sets out intervals of time during which instrument operations must be performed.

44. The method of claim 29, wherein the channel timeline displays a start time and a duration time of each designer item operation.

45. The method of claim 26, wherein the designer items are grouped in accordance with instrument capability, including an analog capability, a digital capability and a bus capability.

46. The method of claim 26, including a time control function wherein if duration of a current test operation exceeds its configured time, the processor adjusts a start time of remaining ATE test operations and then starts the execution of a next ATE test operations, and if duration of the current test operation if less that its configured time then the processor executes a delay until a start time of the next test operation reached.

47. The method of claim 29, wherein unit under test pins are assigned to the channel headers.

* * * * *